United States Patent
Mäki et al.

(10) Patent No.: US 11,046,188 B2
(45) Date of Patent: Jun. 29, 2021

(54) SYSTEM FOR DETERMINING AN INDICATOR OF AN INTERNAL LEAKAGE CURRENT OF A BATTERY ENTITY

(71) Applicant: Akkurate Oy, Piispanristi (FI)

(72) Inventors: Jani Mäki, Turku (FI); Jari Koskinen, Rusko (FI)

(73) Assignee: Akkurate Oy, Piispanristi (FI)

( * ) Notice: Subject to any disclaimer, the term of this patent is extended or adjusted under 35 U.S.C. 154(b) by 254 days.

(21) Appl. No.: 16/181,486

(22) Filed: Nov. 6, 2018

(65) Prior Publication Data
US 2019/0245252 A1    Aug. 8, 2019

(30) Foreign Application Priority Data

Feb. 8, 2018    (FI) .................................... 20185114

(51) Int. Cl.
*B60L 3/00* (2019.01)
*H01M 10/48* (2006.01)
(Continued)

(52) U.S. Cl.
CPC ........... *B60L 3/0046* (2013.01); *B60L 3/0069* (2013.01); *G01R 19/16542* (2013.01);
(Continued)

(58) Field of Classification Search
CPC ....... H01M 10/482; H01M 2010/4278; H01M 2220/20; H01M 2220/30;
(Continued)

(56) References Cited

U.S. PATENT DOCUMENTS

| | | | | |
|---|---|---|---|---|
| 5,945,805 A | * | 8/1999 | Takei | ............... G01R 19/16542 320/124 |
| 2008/0048617 A1 | | 2/2008 | Yoshida | |

(Continued)

FOREIGN PATENT DOCUMENTS

| | | |
|---|---|---|
| EP | 2891577 A2 | 7/2015 |
| GB | 2534314 A | 7/2016 |
| KR | 101725498 B1 | 10/2017 |

OTHER PUBLICATIONS

Extended European Search Report for European Patent Application No. EP18181569.7, dated Jan. 21, 2019, 7 pages.
(Continued)

*Primary Examiner* — Akm Zakaria
(74) *Attorney, Agent, or Firm* — Ziegler IP Law Group, LLC (57) ABSTRACT

A system for determining an indicator of an internal leakage current of a battery entity includes a voltage meter configured to be coupled to the battery entity and to measure a plurality of voltage values corresponding to the battery entity at a plurality of time instants. Further, the system includes an isolator configured to be coupled to each of a battery charger and an electricity consuming entity, as well as to electrically isolate the battery entity from each of the battery charger and the electricity consuming entity based on a control signal. Yet further, the system includes a controller electrically coupled to each of the voltage meter and the isolator the controller being configured to determine the indicator of an internal leakage current based on each of the plurality of voltage values.

13 Claims, 6 Drawing Sheets

(51) Int. Cl.
 *G01R 31/3842* (2019.01)
 *G01R 19/165* (2006.01)
 *B60L 58/10* (2019.01)
 *G01R 31/52* (2020.01)

(52) U.S. Cl.
 CPC ...... *G01R 31/3842* (2019.01); *H01M 10/482* (2013.01); *B60L 58/10* (2019.02); *G01R 31/52* (2020.01)

(58) Field of Classification Search
 CPC .......... H01M 2010/4271; H01M 10/48; G01R 31/50; G01R 31/3842; G01R 19/16542; G01R 31/392; G01R 31/025; G01R 19/00; G01R 31/00; G01R 31/002; G01R 31/36; B60L 3/0046; B60L 3/0069; B60L 58/10; Y02T 10/70
 See application file for complete search history.

(56) References Cited

U.S. PATENT DOCUMENTS

| | | | |
|---|---|---|---|
| 2008/0239628 A1* | 10/2008 | Tatebayashi | H02J 7/0016 |
| | | | 361/434 |
| 2009/0179655 A1 | 7/2009 | Trenches Magana et al. | |
| 2010/0237872 A1 | 9/2010 | Kang | |
| 2012/0004873 A1* | 1/2012 | Li | B60L 3/0046 |
| | | | 702/63 |
| 2014/0132237 A1* | 5/2014 | Barnette | H02M 3/1584 |
| | | | 323/286 |
| 2015/0168497 A1 | 6/2015 | Tabatowski-Bush | |
| 2018/0183252 A1* | 6/2018 | Kim | H02J 7/0021 |
| 2019/0157896 A1* | 5/2019 | Cha | H02J 7/00714 |
| 2019/0195952 A1* | 6/2019 | Riley | G01R 31/382 |

OTHER PUBLICATIONS

International Search Report, Application No. 20185114, dated May 9, 2018, 2 Pages.

* cited by examiner

FIG. 6

SYSTEM FOR DETERMINING AN INDICATOR OF AN INTERNAL LEAKAGE CURRENT OF A BATTERY ENTITY

TECHNICAL FIELD

The present disclosure relates generally to rechargeable batteries; and more specifically, to methods and systems for analyzing the condition, health, and safety of the rechargeable batteries.

BACKGROUND

Rechargeable batteries are widely used, for example, in portable electronic devices and electric vehicles. However, the rechargeable batteries sometimes fail unexpectedly which may lead to loss of money, property or might risk health of a person.

One possible failure mechanism of a battery cell or a battery unit is an internal short circuit. The internal short circuit may occur due to many reasons, such as, but not limited to, impurities inside the cell, a mechanical defect, a mechanical defect of materials internal to the cell and lithium plating due to excess charging current, especially at lower temperatures. Further, the internal short circuit has a certain resistance which may change over time. A very low-ohmic short circuit is easily detected, as it leads to overheating of the cell and in extreme cases to thermal runaway. But as the resistance of the short circuit gets higher, the detection of the short circuit becomes increasingly problematic since the lower heat generation may remain unnoticed.

Many battery powered devices often measure current, but the leakage current caused by an internal short circuit cannot be detected with external current consumption measurement. Further, the short-circuit is internal to the cell, therefore external safety components are unable to prevent an incident.

Some systems monitor and compare the duration of the constant voltage (CV) charging phase to the duration of the previous charging cycles. If the CV charging phase takes longer to complete, it may indicate leakage current. However, further investigation is required to determine whether the leakage current is external or internal to the battery entity. Further, some systems measure and compare the current charged capacity with the charged capacity recorded in the earlier charging cycles. If the charged capacity increases significantly, it indicates that a portion of charged energy is leaking. However, a very accurate state-of-charge algorithm is required to measure charged capacity accurately.

Therefore, in light of the foregoing discussion, there exists a need to overcome the aforementioned drawbacks by improved systems for early detection of short circuits to avoid safety issues.

SUMMARY

The present disclosure seeks to provide a system for determining an indicator of an internal leakage current of a battery entity. Specifically, the system is configured to detect high-ohmic short circuits.

In one aspect, the present disclosure provides a system for determining an indicator of an internal leakage current of a battery entity. The system comprises a voltage meter configured to be coupled to the battery entity. Further, the voltage meter is configured to measure a plurality of voltage values corresponding to the battery entity at a plurality of time instants. The system also comprises an isolator configured to be coupled to each of a battery charger and an electricity consuming entity. Further, the isolator is configured to electrically isolate the battery entity from each of the battery charger and the electricity consuming entity based on a control signal. Yet further, the system comprises a controller electrically coupled to each of the voltage meter and the isolator. The controller is configured to detect a first voltage value at a first time instant while the battery entity is electrically connected to each of the battery charger and the electricity consuming entity. The controller is also configured to generate the control signal based on detection of the first voltage value. Further, the controller is configured to detect a second voltage value at a second time instant while the battery entity is electrically isolated from each of the battery charger and the electricity consuming entity. The second time instant is later than the first time instant. Further, the controller is configured to detect a third voltage value at a third time instant while the battery entity is electrically isolated from each of the battery charger and the electricity consuming entity, the third time instant being later than the second time instant. The controller is also configured to determine the indicator of an internal leakage current based on each of the first voltage value, the second voltage value and the third voltage value.

In another aspect, the present disclosure provides a battery entity including a system for determining an indicator of an internal leakage current of the battery entity. The system comprises a voltage meter configured to be coupled to the battery entity. The voltage meter is configured to measure a plurality of voltage values corresponding to the battery entity at a plurality of time instants. Further, the system comprises an isolator configured to be coupled to each of a battery charger and an electricity consuming entity, the isolator being configured to electrically isolate the battery entity from each of the battery charger and the electricity consuming entity based on a control signal. Further, the system comprises a controller electrically coupled to each of the voltage meter and the isolator. The controller is configured to detect a first voltage value at a first time instant while the battery entity is electrically connected to each of the battery charger and the electricity consuming entity. The controller is also configured to generate the control signal based on detection of the first voltage value. Further, the controller is configured to detect a second voltage value at a second time instant while the battery entity is electrically isolated from each of the battery charger and the electricity consuming entity. The second time instant is later than the first time instant. The controller is also configured to detect a third voltage value at a third time instant while the battery entity is electrically isolated from each of the battery charger and the electricity consuming entity. The third time instant is later than the second time instant. Further, the controller is configured to determine the indicator of the internal leakage current based on each of the first voltage value, the second voltage value and the third voltage value.

In another aspect, the present disclosure provides a mobile device including a system for determining an indicator of an internal leakage current of a battery entity comprised in the mobile device. The system is as described above. In yet another aspect, the present disclosure provides an electric vehicle including a system for determining an indicator of an internal leakage current of a battery entity comprised in the electric vehicle, wherein the system is as described above.

In yet another aspect, the present disclosure provides a method of determining an indicator of an internal leakage current of a battery entity. The method comprises detecting, using a voltage meter, a first voltage value at a first time instant while the battery entity is electrically connected to each of a battery charger and an electricity consuming entity. Further, the method comprises generating, using a controller, a control signal based on the detecting of the first voltage value. Yet further, the method comprises electrically isolating, using an isolator, the battery entity from each of the electricity consuming entity and a battery charger based on the control signal. Moreover, the method comprises detecting, using the voltage meter, a second voltage value at a second time instant while the battery entity is electrically isolated from each of the battery charger and the electricity consuming entity. The second time instant is later than the first time instant. Further, the method comprises detecting, using the voltage meter, a third voltage value at a third time instant while the battery entity is electrically isolated from each of the battery charger and the electricity consuming entity. The third time instant is later than the second time instant. Yet further, the method comprises determining, using the controller, the indicator of the internal leakage current based on each of the first voltage value, the second voltage value and the third voltage value.

Embodiments of the present disclosure substantially eliminate or at least partially address the aforementioned problems in the prior art, and enables safe operation of battery entities, which may save money, property or might make operation of a device safer. Further, the disclosed systems detect internal current leakage using readily available affordable components. Yet further, the disclosed systems accurately detect the internal current leakage without relying solely on unreliable parameters like temperature of the battery. Moreover, the disclosed systems may be used in any battery-powered device, which may operate using a charger as a power source while disconnecting the battery from the device. Further, the disclosed systems are invisible to the end-user. Still further, there is no need for external measurement devices. Moreover, the disclosed systems can automatically run as a background task. Moreover, the disclosed system and method might enable longer operational life time of a battery entity and thus of a device wherein the battery entity is used.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

In the accompanying drawings, a non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In one aspect, the present disclosure provides a system for determining an indicator of an internal leakage current of a battery entity. The system comprises a voltage meter configured to be coupled to the battery entity. Further, the voltage meter is configured to measure a plurality of voltage values corresponding to the battery entity at a plurality of time instants. The system also comprises an isolator configured to be coupled to each of a battery charger and an electricity consuming entity. Further, the isolator is configured to electrically isolate the battery entity from each of the battery charger and the electricity consuming entity based on a control signal. Yet further, the system comprises a controller electrically coupled to each of the voltage meter and the isolator. The controller is configured to detect a first voltage value at a first time instant while the battery entity is electrically connected to each of the battery charger and the electricity consuming entity. The controller is also configured to generate the control signal based on detection of the first voltage value. Further, the controller is configured to detect a second voltage value at a second time instant while the battery entity is electrically isolated from each of the battery charger and the electricity consuming entity. The second time instant is later than the first time instant. Further, the controller is configured to detect a third voltage value at a third time instant while the battery entity is electrically isolated from each of the battery charger and the electricity consuming entity, the third time instant being later than the second time instant. The controller is also configured to determine the indicator of an internal leakage current based on each of the first voltage value, the second voltage value and the third voltage value.

The present description thus relates to a system to monitor a battery voltage during a charge cycle, most typically in CV (Constant Voltage) charging phase of a battery. The charging of the battery is paused for a pre-determined time (by isolating the battery) and the resulting change in the battery voltage is monitored and compared against earlier measurements. Further, the system may be powered from the charger during the monitoring, so the battery voltage is not affected by the system power consumption. If the behavior of the battery voltage differs significantly from the previous measurements, or the hard voltage limits are exceeded, alerts are generated. Further, it is also possible to isolate the battery and carry out measurements after the battery has been fully charged (charger needs to be connected to power the system while the battery is isolated). When selecting the predetermined time for carrying out measurements to detect voltage values selecting a longtime value will provide more accurate results than short time value. However, if the time is very long it might not be feasible as the charging of the battery is interrupted. The predetermined time depends on the battery type and other parameters such as target device requirements and usage of the target device.

According to an embodiment, the controller detects the first, the second and the third voltage value by reading a measured voltage value from a voltage meter. The voltage meter can refer to an analog/digital conversion (AD) unit or similar, configured to measure voltages. There can be more than one voltage meter in a setup if simultaneous measurements from multiple cell entities of the battery entity at the same time are desired. Alternatively, the coupling of a (single) voltage meter can be arranged to enable measurement of voltages from multiple cell entities or over the entire battery entity. Further, the voltage values can be detected more than three times, i.e. for example a fourth, a fifth etc. N:th voltage value might be detected. According to another embodiment, at least three measurements are used. Adding the number of measurements over three might increase accuracy of the system.

In some exemplary embodiments, the battery entity may consist of a single cell, or a number of cells connected in series, or a number of cell entities connected in series. Further, the cell entity may refer to a number of cells connected in parallel, such that each cell in the cell entity has the same voltage. Moreover, the cell may refer to a single battery cell. The cells may be connected in series and/or in parallel.

In some exemplary embodiments, the system may be a battery management system (BMS). The BMS may include electric circuitry for controlling the battery charging and monitoring the voltage(s) of a cell, cell entities, and battery entities. For example, in case of battery entity consisting of a single cell, the BMS may typically be a Power Management ASIC inside the corresponding device. The device is then powered by the battery entity.

In some embodiments, the controller may be further configured to generate the control signal based on the first voltage value being at least equal to a target voltage. For example, the target voltage may indicate that the battery entity is fully charged or nearly fully charged.

In some embodiments, the battery entity may include a plurality of cell entities connected in series. Further, a cell entity may include at least one cell. Further, the plurality of voltage values may correspond to a voltage value of a cell entity of the plurality of cell entities. Indeed, in some embodiments, the measured plurality of voltage values corresponding to the battery entity are measured as at least one of: voltage values corresponding to voltage values across entire battery entity, voltage values corresponding to voltage values of at least one cell entity or voltage values corresponding to voltage values of at least one cell. The "voltage values across the entire battery entity"—term refer to voltage between ground level/zero level i.e. negative terminal of the battery entity and maximum voltage of the battery entity (i.e. positive terminal of the battery entity). The voltage values of at least one cell entity refer to measurement of voltage of at least one cell entity. For example, if the battery entity consists of three cell entities connected in series, voltage values can be measured over any of the three entities separately or for example over two cell entities or over all three entities (which would equal to measuring over the entire battery entity). The voltage values of at least one cell correspond to measuring voltage across at least one cell. For example, if the battery entity consists of three cells connected in series, voltage values can be measured over any of three cells separately or for example over two cells or over all three cells (which would in this example equal to measuring over the entire battery entity). Further, if cells are connected in parallel, measurement of voltage values can be done by isolating cells to be measured from the parallel setup during the measurement cycle.

In some embodiments, the system may further include a current meter configured to be coupled to the battery entity coupled to measure the current of the battery entity. The current meter may be further configured to measure charging current value passing through the battery entity. Further, the controller may be electrically coupled to the current meter. The controller may be further configured to detect the charging current value being below a predetermined level. The charging current value being below a predetermined level may indicate that the battery entity is fully charged. Further, generation of the control signal may be further based on detection of the charging current value being below the predetermined level.

In some embodiments, the controller may be further configured to generate an alert based on the indicator of the internal leakage current. The internal short circuit is considered a serious safety issue. Therefore, the alert may warn the user to stop using the battery entity immediately.

In some embodiments, the controller may be communicatively coupled to the battery charger. Further, the controller may be configured to control at least one charging parameter of the battery charger based on the indication of the internal leakage current. For example, the at least one charging parameter may include any operational parameter.

In some embodiments, the controller may be further configured to determine a first slew rate between the first voltage value and the second voltage value based on the first time instant and the second time instant. Moreover, the controller may be configured to determine a second slew rate between the second voltage value and the third voltage value based on the second time instant and the third time instant. The determination of the indicator of the internal leakage current may be based on each of the first slew rate and the second slew rate.

In some embodiments, the controller may be further configured to determine a first voltage difference between the first voltage value and the second voltage value. Yet further, the controller may be configured to determine a second voltage difference between the second voltage value and the third voltage value. The determination of the indicator of the internal leakage current may be based on each of the first voltage difference and the second voltage difference.

In further embodiments, the plurality of voltage values may include a previous first voltage value, a previous second voltage value, and a previous third voltage value, each corresponding to a previous time period. Further, each of the first voltage value, the second voltage value, and the third voltage value may correspond to a current time period later than the previous time period. Further, the system may include a memory configured to store each of the previous first voltage value, the previous second voltage value and the previous third voltage value. Yet further, the controller may be configured to determine a previous first voltage difference between the previous first voltage value and the previous second voltage value. The controller may be configured to determine a previous second voltage difference between the previous second voltage value and the previous third voltage value. The controller may also be configured to perform a first comparison between the first voltage difference with the previous first voltage difference. Further, the controller may be configured to perform a second comparison between the second voltage difference with the previous second voltage difference. Furthermore, the indicator of the internal leakage current may be based on a result of the first comparison and the second comparison.

In further embodiments, the controller may be configured to transmit, using a communication device, each of the first voltage value, the second voltage value, the third voltage value, the first time instant, the second time instant, the third time instant and an identifier associated with the battery entity to a cloud server.

In further embodiments, the controller may be configured to receive, using the communication device, each of the previous first voltage value, the previous second voltage value, the previous third voltage value and corresponding time instants of the previous time period from the cloud server.

In some embodiments, the second time instant may be greater than the first time instant by a predetermined time value. Further, the system may include a memory configured to store the predetermined time value. Further, the memory may be communicatively coupled to the controller. As an example, the time instants can be determined for each battery entity/device type separately or those can be updated based on measurements and verifications related to cells used in the system. Further measurement capabilities of the system (speed of a voltage meter or controller) may limit the sample rate. The time between first and second measurement can be a few seconds (for example 5 seconds) while the time between second and third measurement can be several minutes (10 minutes for example) depending on the used battery technology and battery entity setup. Alternatively, the time instant of the first measurement can be the instant the pre-determined target voltage and target current have been reached, and before the battery entity is isolated from the system. The target voltage and target current may be the same than used for charging the battery. The time instant for the second measurement should occur after the battery has been isolated from the system. The time instant for the third measurement should occur at the end of the testing period, right before connecting the battery back to the system. The time between the first and third measurement might be quite long (10 minutes or more) for accurate measurement and depending on the cell/battery type. The time between the first and second measurement can be anything from a couple of seconds to several minutes, depending on used battery entity.

In some embodiments, the first voltage value may include a plurality of first voltage samples corresponding to a plurality of first time instants. The second voltage value may include a plurality of second voltage samples corresponding to a plurality of second time instants. The third voltage value may include a plurality of third voltage samples corresponding to a plurality of third time instants. Further, the controller may be configured to determine the first voltage value based on the plurality of first voltage samples. Yet further, the controller may be configured to determine the second voltage value based on the plurality of second voltage samples. The controller may also be configured to determine the third voltage value based on the plurality of third voltage samples.

In some embodiments, the controller may be configured to generate a circuit model corresponding to the battery entity based on each of the first voltage value, the second voltage value, the third voltage value, the first time instant, the second time instant and the third time instant. Further, the controller may be configured to determine an internal leakage resistance corresponding to the battery entity based on the circuit model.

In some embodiments, the system may further include a memory configured to store a training data including a plurality of first voltage values, a plurality of second voltage values, a plurality of third voltage values corresponding to a plurality of distinct time periods and a plurality of indicators of internal leakage current corresponding to the plurality of distinct time periods. Further, the controller may be configured to perform machine learning based on the training data. Further, the determination of the indicator of the internal leakage current may be based on the machine learning. The training data refers to a set of measurement cycles and setups where the condition of a battery entity and/or cell entities and/or cells of the battery entity is known. When training the machine learning system, the set of measurement cycles is used as the training data. The training data is associated during the training with desired indicators.

In further embodiments, the training data may be stored on the cloud server. The cloud server may be configured to perform machine learning based on the training data. The determination of the indicator of the internal leakage current may thus be based on the machine learning.

In some embodiments, the controller may be further configured to receive one or more of a temperature associated with the battery entity and an age of the battery entity. Further, the determination of the indication of the internal leakage current may be based on one or more of the temperature and the age. The age of the battery can refer to calendar life of the battery or for example number of charging and de-charging cycles. Further, the controller can be configured to receiver other state-of-health indicators such as reduction of capacity in relation to nominal capacity and battery entity impedance.

In another aspect, the present disclosure provides a battery entity including a system for determining an indicator of an internal leakage current of the battery entity. The system is as disclosed above. In yet another aspect, the present disclosure provides a mobile device including a system for determining an indicator of an internal leakage current of a battery entity comprised in the mobile device, as disclosed above. The present disclosure still further provides an electric vehicle including a system, as described above, for determining an indicator of an internal leakage current of a battery entity comprised in the electric vehicle.

In another aspect, the present disclosure provides a method of determining an indicator of an internal leakage current of a battery entity. The method comprises detecting, using a voltage meter, a first voltage value at a first time instant while the battery entity is electrically connected to each of a battery charger and an electricity consuming entity. Further, the method comprises generating, using a controller, a control signal based on the detecting of the first voltage value. Yet further, the method comprises electrically isolating, using an isolator, the battery entity from each of the electricity consuming entity and a battery charger based on the control signal. Moreover, the method comprises detecting, using the voltage meter, a second voltage value at a second time instant while the battery entity is electrically isolated from each of the battery charger and the electricity consuming entity. The second time instant is later than the first time instant. Further, the method comprises detecting, using the voltage meter, a third voltage value at a third time instant while the battery entity is electrically isolated from each of the battery charger and the electricity consuming entity. The third time instant is later than the second time instant. Yet further, the method comprises determining, using the controller, the indicator of the internal leakage current based on each of the first voltage value, the second voltage value and the third voltage value.

According to an exemplary embodiment, a system includes a smartphone, a USB charger as an external power supply and a battery entity comprising of one cell. According to another exemplary embodiment, a system includes an electric vehicle (such as an eBike), a mains charger as an external power supply and a battery entity. The battery entity may comprise for example 120 cells arranged as 12 cell entities. Each cell entity may include 10 cells.

The battery entity of the smartphone or the electric vehicle may be charged from the external power supply. As the voltage level of the battery entity reaches the target voltage, the charging mode may switch from Constant Current (CC) to Constant Voltage (CV) mode, and the charging current starts to decrease gradually. Thereafter, when a pre-determined charging current level is reached, the battery entity may be isolated from the rest of the electronics for a pre-determined period of time. The device power may be supplied from the external power supply. During this time period, the voltage of the battery may be measured, at least, just before isolating the battery (first time), after isolating the battery (second time) and before connecting the battery back to the system (third time). Second time instant is between the first and the third time instants. If the second time instant is close to first time instant, measuring the resistive qualities of the battery might be emphasized over capacitive qualities. If more than three voltage samples are used, both resistive and capacitive qualities might be measured more accurately. More voltage samples may be measured to obtain better approximation of the voltage behaviour. In case of a battery entity with multiple cells, if a BMS does not support simultaneous voltage measurement for all cell entities, the procedure may be repeated for each cell entity. Alternatively, the charging mode is not switched on before the isolation.

In addition to using voltage data as an input to determine short circuits, one or more of, but not limited to, a battery temperature, a battery cycle life, and a battery calendar life may be obtained to make the analysis more accurate.

The measured result may be analyzed and alert for the system may be raised, if the voltage levels during isolation go below pre-determined alert limits, or the voltage behavior is significantly different from behavior measured earlier. The measured data may be stored locally and also to cloud server. The data analysis may be done locally or in the cloud server. The benefit of using the cloud server is to obtain a large amount of data for a machine learning algorithm to learn how the battery behaves in real-life conditions. This may lead to increased accuracy in analysis. In case of a battery entity with multiple cells, the battery cells are expected to be identical in the battery entity, so it is expected to see identical voltage behavior between all the 12 cell entities. A deviation in one cell entity is also a reason to raise an alert. On the other hand, the electric vehicles typically do not have an access to cloud servers, so all the data can be stored and analyzed locally.

If the analysis gives a result indicating a problem, the system needs to act on it, and may perform one or more actions in response. In nascent cases, a silent alert may be sent out. For example, a message may be sent to the manufacturer, who could, in turn, call the device to a service point for maintenance. Also, the charging parameters may be limited to avoid making the issue more serious (by limiting charging voltage and current). In serious cases, the end-user should be warned and instructed to stop using the device and taking it to a service point. Further, the charging may be prohibited.

DETAILED DESCRIPTION OF THE DRAWINGS

Figure 1:
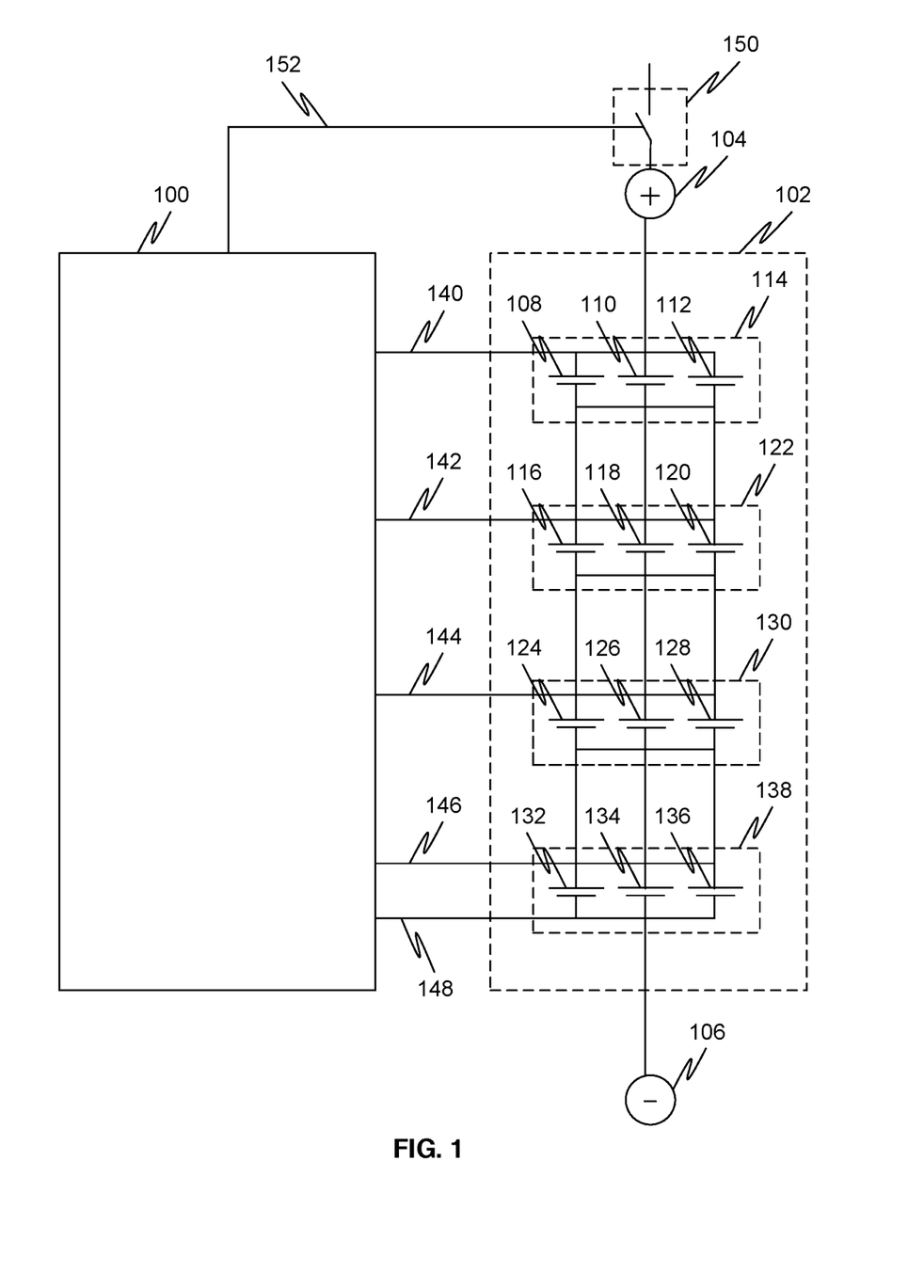
FIG. 1 is a schematic illustration of a system for determining an indicator of an internal leakage current of a battery entity, in accordance with an embodiment.

FIG. 1 is a schematic illustration of a system 100 for determining an indicator of an internal leakage current of a battery entity 102, in accordance with an embodiment.

The battery entity 102 includes a positive terminal 104 and a negative terminal 106. Further, the battery entity 102 consists of 12 cells, arranged in a 4S3P format (i.e. 4 cell entities connected in Series, 3 cells Parallel in each cell entity). As shown, cells 108, 110 and 112 are connected in parallel, making up a cell entity 114. Further, cells 116, 118 and 120 are connected in parallel, making up a cell entity 122. Yet further, cells 124, 126 and 128 are connected in parallel, making up a cell entity 130. Further, cells 132, 134 and 136 are connected in parallel, making up cell entity 138. Moreover, cell entities 114, 122, 130 and 138 are connected in series, making up the battery entity 102.

Further, the system 100 comprises a voltage meter (not shown) configured to be coupled to the battery entity 102. The voltage meter is further configured to measure a plurality of voltage values corresponding to the battery entity 102 at a plurality of time instants. Accordingly, the system 100 may be capable of monitoring and logging the voltage of each cell entity 114, 122, 130 and 138 as well as the voltage of battery entity 102. The voltage may be measured via sense lines 140, 142, 144, 146, and 148.

Further, the system 100 comprises an isolator 150 configured to be coupled to one or both of a battery charger and an electricity consuming entity. The electricity consuming entity may be an electrical device being powered by the battery entity 102. The isolator 150 is further configured to electrically isolate the battery entity 102 from each of the battery charger and the electricity consuming entity based on a control signal sent via a control line 152.

Further, the system 100 comprises a controller (not shown) electrically coupled to each of the voltage meter and the isolator. The controller is configured to detect a first voltage value at a first time instant while the battery entity 102 is electrically connected to each of the battery charger and the electricity consuming entity. Further, the controller is configured to generate the control signal based on detection of the first voltage value. The controller may be further configured to generate the control signal based on the first voltage value being at least equal to a target voltage.

Further, the controller is configured to detect a second voltage value at a second time instant while the battery entity is electrically isolated from each of the battery charger and the electricity consuming entity, wherein the second time instant is later than the first time instant. Further, the controller is configured to detect a third voltage value at a third time instant while the battery entity is electrically isolated from each of the battery charger and the electricity consuming entity, wherein the third time instant is later than the second time instant. Further, the controller is configured to determine the indicator of an internal leakage current based on each of the first voltage value, the second voltage value and the third voltage value. The controller may be further configured to generate an alert based on the indicator of the internal leakage current.

Figure 2:
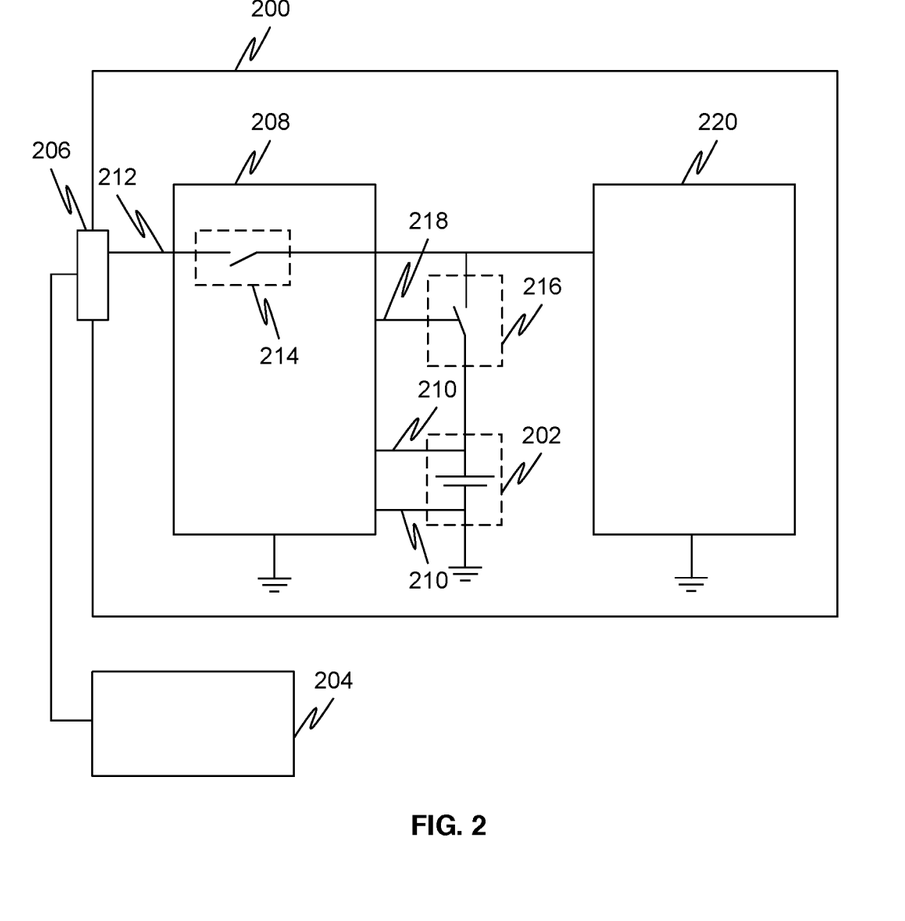
FIG. 2 is a schematic illustration of a device powered by a battery entity, in accordance with an embodiment.

FIG. 2 is a schematic illustration of a device 200 powered by a battery entity 202, in accordance with an embodiment. For example, the device 200 may be a smartphone or an electric vehicle. The battery entity 202 may comprise a single cell or a number of cells, arranged as series connected cells or cell entities. However, for the sake of simplicity, a single cell is illustrated in FIG. 2.

Further, the device 200 may also be powered from an external power supply 204, which is connected to the device 200 via a power supply connector 206. The external power supply 204 may be, for example, a USB charger for smartphones.

A BMS 208 (similar to the system 100) may monitor and log the voltage of the battery entity 202. Further, the BMS 208 may monitor and log the voltages of all the cell entities in the battery entity 202. The voltages may be measured via a plurality of sense lines 210. The BMS 208 may control the external power supply either by communicating with the external power supply 204 via a separate control bus 212 or by controlling a switch 214 integrated into one of the device 200 and the BMS 208.

The BMS 208 may isolate the battery entity 202 from electrical components 220 of the device 200 with another switch 216 via a control line 218. The electrical components 220 of the device 200 may be powered by one or both of the battery entity 202 and the external power supply 204. The powering scheme is controlled by BMS 208 with the switches 214 and 216. The electrical components 220 may include, but are not limited to, a CPU, memories, displays, user interfaces, motors, and actuators.

According to an embodiment of the disclosure, a method for determining an indicator of an internal leakage current of the battery entity 202 is disclosed. The method includes charging the battery entity 202 with the external power supply 204. Accordingly, the switches 214 and switch 216 are closed.

As the battery entity 202 reaches its target voltage, the method includes changing the charging mode from Constant Current (CC) charging to Constant Voltage (CV) charging and the charging current starts to gradually decrease. Thereafter, once the charging current drops below a pre-determined level, the method includes isolating the battery entity 202 from the rest of the device 200 by opening the switch 216. Therefore, the components 220 are powered from the external power supply 204, as the switch 214 is still closed.

The battery entity 202 is isolated for a pre-determined time. Further, the method includes logging the voltage behaviour of the battery entity 202. Further, the method may include logging the voltage behaviour of each cell entity in the battery entity 202.

Once the pre-determined time is over, the method includes connecting the battery entity 202 to rest of the device 200 by closing the switch 216 and the charging continues normally.

Thereafter, the method includes analyzing the logged voltage results. The results may be compared to previous measurement results as well as against pre-determined voltage limits. If the pre-determined voltage limits are crossed, an alert may be raised. Further, the alert may also be raised, if the result has changed significantly from previous measurements.

Figure 3:
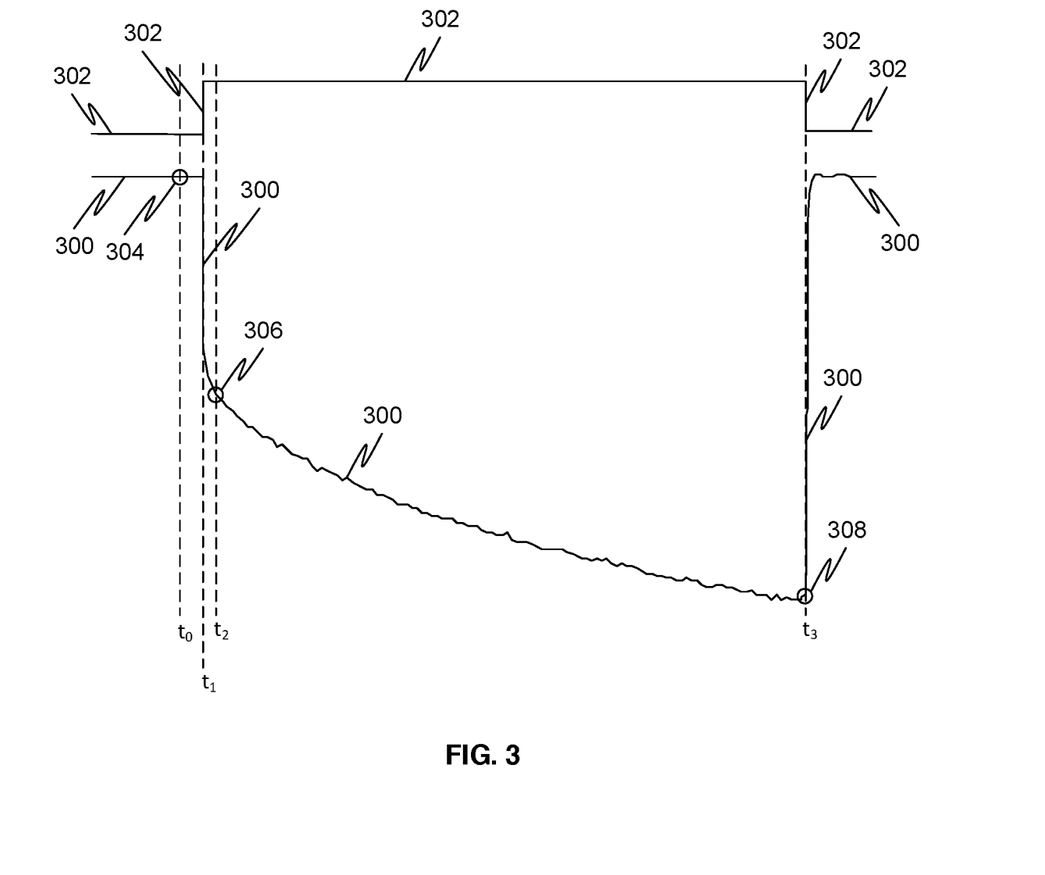
FIG. 3 is a graph showing voltage changes for a battery entity during an operating cycle of the system, in accordance with some embodiments.

FIG. 3 is a graph showing voltage changes for the battery entity 102 during an operating cycle of the system 100, in accordance with some embodiments. The graph plots voltage values versus time. Accordingly, a voltage 300 of the battery entity 102 is plotted against time in the graph. Also a state 302 of the isolator 150 is shown. At time $t_1$, the isolator changes the state from a closed state to an open state. Therefore, at $t_1$, the battery entity 102 is isolated from an external power supply and a load. Thereafter, the voltage of the battery entity 102 starts decreasing.

Accordingly, voltage samples 304, 306, and 308 are recorded at three time instants—a first time instant $t_0$, a second time instant $t_2$ and a third time instant $t_3$. The instant voltage drop $(V(t_2)-V(t_0))$ between samples 304 and 306 quantifies the resistive characteristics of the battery. The voltage drop $(V(t_3)-V(t_2))$ between samples 306 and 308 quantifies the capacitive characteristics of the battery.

In further embodiments, for each voltage sample, multiple voltage samples may be measured in a short time period to obtain multiple voltage measurements. Then, using the multiple voltage measurements one of an average value, a median value, etc. may be obtained to improve the accuracy of the corresponding voltage sample.

In some embodiments, a first slew rate between the first voltage value $V(t_0)$ and the second voltage value $V(t_2)$ is determined based on the first time instant $t_0$ and the second time instant $t_2$. In further embodiments, a second slew rate between the second voltage value $V(t_2)$ and the third voltage value $V(t_3)$ based on the second time instant $(t_2)$ and the third time instant $(t_3)$. Thereafter, the internal leakage current is determined based on each of the first slew rate and the second slew rate.

In some embodiments, one or both of the first slew rate and the second slew rate may be compared with predetermined threshold values to determine the internal leakage current. In alternate embodiments, one or both of the first slew rate and the second slew rate may be compared with one or more of the previous first slew rates and the previous second slew rates recorded in the past. The values of the one or more of the previous first slew rates and the previous second slew rates may be obtained from one of a memory of the system 100 and a cloud server.

In some embodiments, one or both of the voltage differences $(V(t_2)-V(t_0))$ and $(V(t_3)-V(t_2))$ may be compared with one or more previous voltage differences recorded in the past. The values of the one or more previous voltage differences may be obtained from a memory of the system 100. Alternatively, the values of the one or more previous voltage differences may be obtained from a cloud server. Further, sudden increases in either or both $(V(t_2)-V(t_0))$ and $(V(t_3)-V(t_2))$ may indicate a nascent short circuit. Moreover, a big difference in $(V(t_3)-V(t_2))$ may indicate that the battery voltage does not stabilize, i.e. the battery is leaking current.

In further embodiments, the controller may transmit, using a communication device, each of the first voltage value $V(t_0)$, the second voltage value $V(t_2)$, the third voltage value $V(t_3)$, the first time instant $t_0$, the second time instant $t_2$, the third time instant $t_3$ and an identifier associated with the battery entity 102 to the cloud server. The identifier may include information related to one or more of a manufacturer, model, and manufacturing date.

In some embodiments, the second time instant $t_2$ may be greater than the first time instant $t_0$ by a first predetermined time value. Further, the third time instant $t_3$ is greater than the second time instant $t_2$ by a second predetermined time value. The value of the first predetermined time value and the second predetermined time value may be obtained from one of the memory and the cloud server. For example, the first predetermined time value may be 10 seconds and the second predetermined time value may be 2 minutes.

Figure 4:
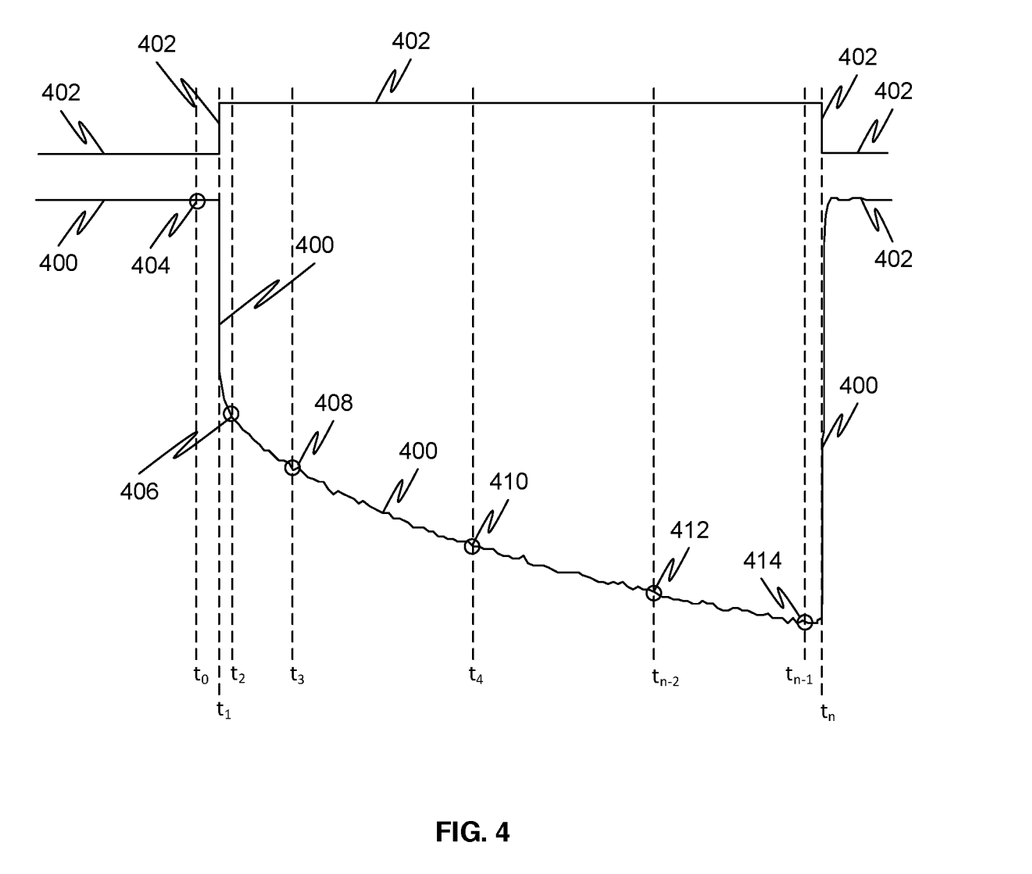
FIG. 4 is a graph showing voltage changes for a battery entity during an operating cycle of the system, in accordance with some embodiments.

FIG. 4 is a graph showing voltage changes for the battery entity 102 during an operating cycle of the system 100, in accordance with some embodiments. The graph plots voltage values versus time. Accordingly, a voltage 400 of the battery entity 102 is plotted against time in the graph. Also a state 402 of the isolator 150 is shown.

At time $t<t_0$, the battery entity 102 is undergoing a normal charging operation. Then, at time $t=t_0$, voltage logging is initiated and a first voltage sample 404 is measured before opening the isolator 150.

At time $t=t_1$, the isolator 150 is opened such that the battery entity 102 is not under any load. The voltage drops instantly in relation to battery internal resistance. At time $t=t_2$, another voltage sample 406 is measured as soon as possible after opening the isolator 150.

Then, at times $t=t_3, t_4, \ldots t_{n-2}, t_{n-1}$, more voltage samples 408, 410 . . . 412, 414 are logged. The number of voltage samples may be based on the capabilities of the system 100 as well as the total measurement time $T=t_n-t_1$. A longer total measurement time makes the detection of internal short circuit easier, but the charging time gets longer. Further, a longer total measurement time increases the accuracy of the internal short circuit detection since the battery voltage stabilization may take several minutes. The voltage stabilization does not occur if the battery entity is under load. The battery voltage stabilization takes less time if the battery entity has not been loaded heavily. Therefore, the measurement may be performed when the battery is almost fully charged and the charging current is quite small. Further, when the battery entity is almost fully charged battery there is a natural swelling (i.e. battery gets thicker) of active materials inside the cells of the battery entity, which is related to charge level. It is possible that the internal short circuiting occurs only when the swollen active materials get in physical contact with each other.

Further, the total measurement time period may also be adaptive and learn from end-user's charging behaviour. For example, the time period may be longer during overnight charging as the increased charging time does not matter in this charging scenario.

At $t=t_0$, the isolator 150 is closed. Thereafter, at time $t>t_0$, the normal charging operation continues. The controller then analyses the measurement results and raises alerts if necessary.

Further, the voltage samples collected during time T ($t_n-t_1$) may be used to create an approximation of voltage behaviour. The approximation may be saved for comparison of voltage behaviour over time. The approximation may be also compared to the results of other similar devices, if the data is stored on a cloud server. For example, the total measurement time period may be 2 minutes. The voltage at time t0 may be 4.20 V and the voltage at time $t_n$ may be 4.15 V.

Figure 5:
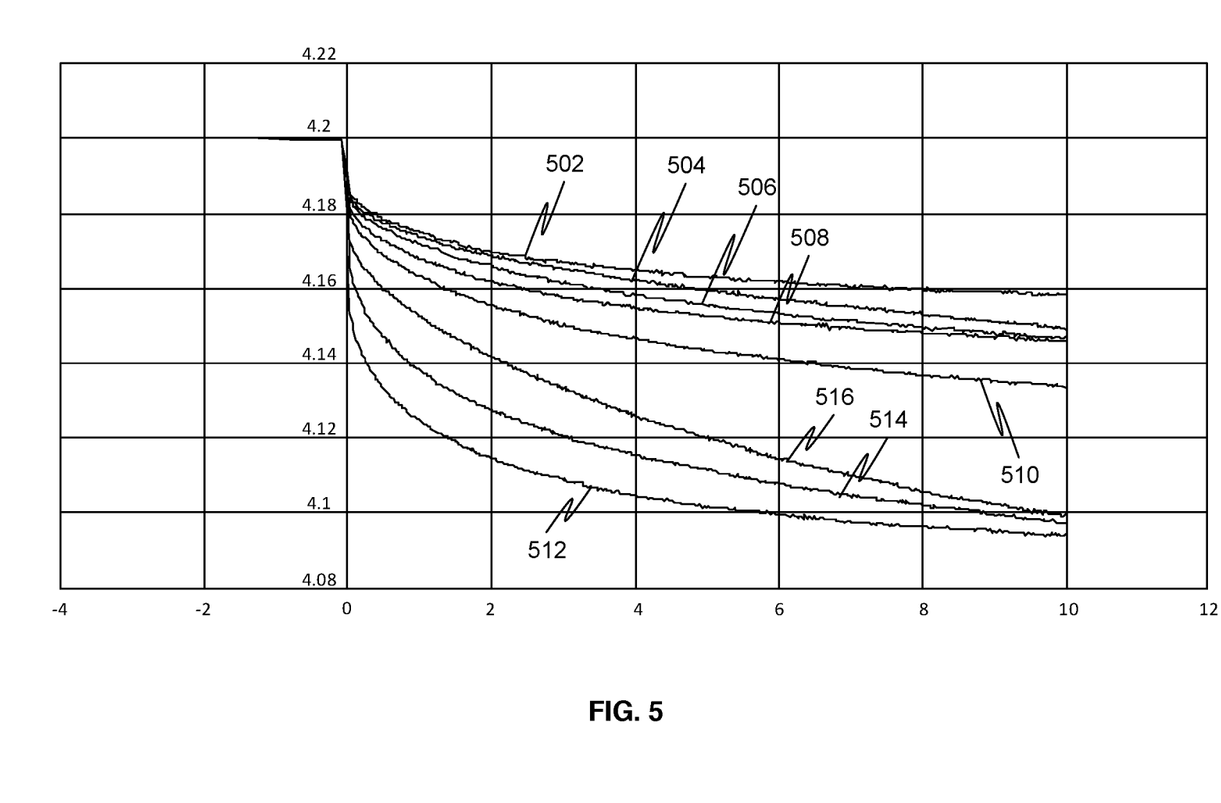
FIG. 5 illustrates graphs showing voltage changes for a battery entity corresponding to the various states of the battery entity, in accordance with some embodiments.

FIG. 5 illustrates graphs 502-516 showing voltage changes for a battery entity corresponding to the various states of the battery entity, in accordance with some embodiments. The graphs 502-516 plot voltage values (V) versus time (minutes). An isolator corresponding to the battery entity may be configured to trigger when the battery is almost full. For example, when the cell capacity (C) drops to C/10 (i.e. 320 mA).

The graph 502 corresponds to a new battery entity. So, the graph 502 provides a fresh reference. The graph 504 corresponds to a new battery entity with 100 mA leakage current. The graph 506 corresponds to a battery entity that has undergone 1000 charging cycles without any leakage current. Similarly, the graphs 508-510 correspond to battery entities that have undergone 1000 charging cycles without any leakage current. However, the graphs 512-514 correspond to battery entities that have undergone 1000 charging cycles and are now found to be battery entities which are no longer feasible to use. The graph 516 corresponds to a battery entity that has undergone 1000 charging cycles and is found to have leaking current.

Figure 6:
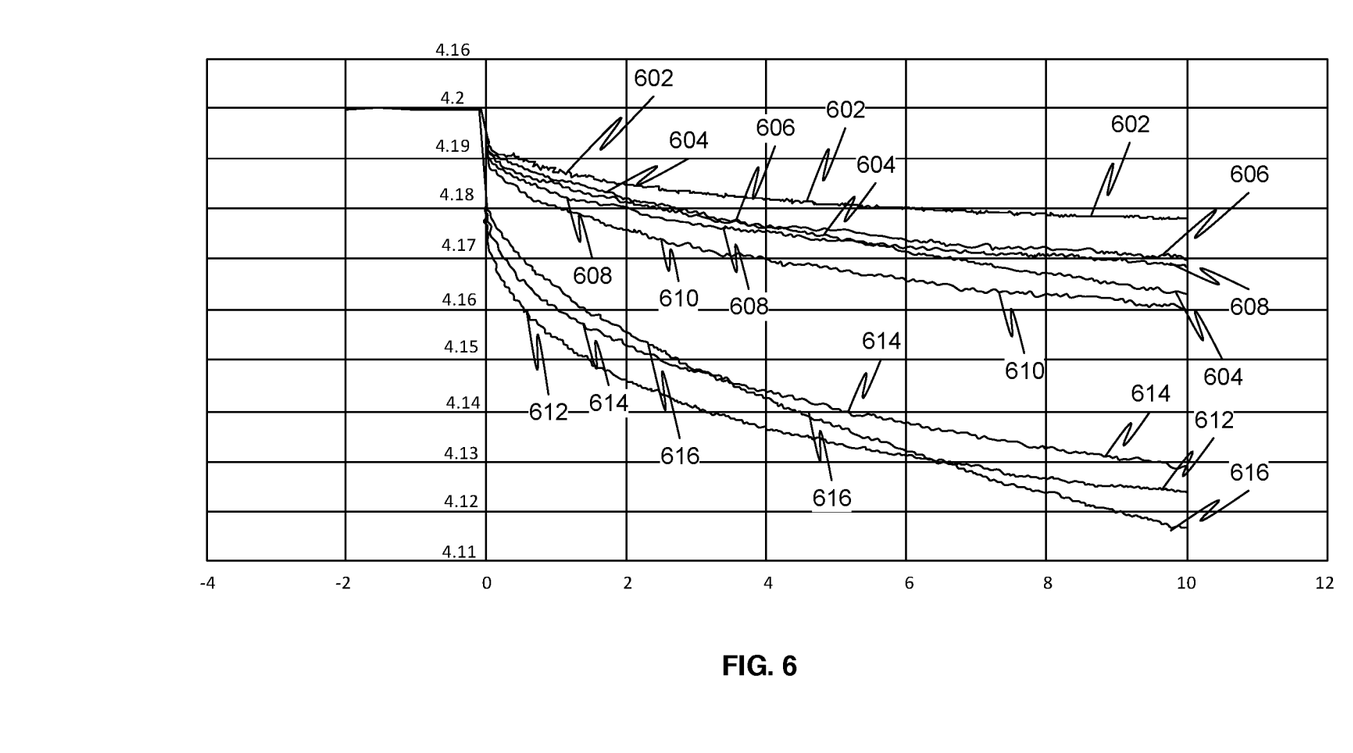
FIG. 6 illustrates graphs showing voltage changes for a battery entity corresponding to the various states of the battery entity, in accordance with some embodiments.

FIG. 6 illustrates graphs 602-616 showing voltage changes for a battery entity corresponding to the various states of the battery entity, in accordance with some embodiments as measured during an example test. The graphs 602-616 plot measured voltage values (V) versus time (minutes). The graphs are measurement results of the example test run, wherein seven 18650 size 3200 mAh Li-ion (lithium ion) cell samples from a same manufacturer and same production batch were tested. The cell samples in the test were as listed in Table 1. Condition of each of the cells was determined before the test (i.e. known)

TABLE I

An example test (related to FIG. 6)

| Sample number | Reference sign in FIG. 6 | Cell condition | Note |
| --- | --- | --- | --- |
| 1 | 602 | Fresh | Used as a reference cell |
| 1b | 604 | Internal short | The same cell as sample 1, with 39 ohm resistor in parallel to simulate ~100 mA leakage |
| 2 | 606 | Aged | 1000 cycles, cell still usable |
| 3 | 608 | Aged | 1000 cycles with deep discharge, cell still usable but capacity has substantially declined |
| 4 | 610 | Aged | 1000 cycles with deep discharge, cell still usable but capacity has substantially declined |
| 5 | 612 | End of life | 1000 cycles, cell not usable |
| 6 | 614 | End of life | 1000 cycles, cell not usable |
| 7 | 616 | Internal short | 1000 cycles, internal short-circuit |

In general, an isolator corresponding to the battery entity may be configured to trigger when the battery is fully charged. For example, when the cell capacity (C) drops to C/20 (i.e. 160 mA). In the example test the test sample 1 was used to obtain the test parameters. The test was performed during a charging cycle. Once the charging cycle was in Constant Voltage (CV) phase and the current dropped below 160 mA (C/20 rate for the tested cell), the cell was disconnected from the charging power allowing the cell voltage to relax. The voltage behavior was logged. The resulting curve 602 can be seen in FIG. 6.

The graph 602 (sample 1) corresponds to a new battery entity. So, the graph 602 provides a fresh reference. The graph 604 (sample 1b) corresponds to a new battery entity with 100 mA leakage current. The graph 606 (sample 2) corresponds to a battery entity that has undergone 1000 charging cycles without any leakage current. Similarly, the graphs 608-610 (samples 3 and 4, respectively) correspond to battery entities that have undergone 1000 charging cycles without any leakage current.

However, the graphs 612-614 (samples 5 and 6, respectively) correspond to battery entities that have undergone 1000 charging cycles and are now found to be dead battery entities. The graph 616 (sample 7) corresponds to a battery entity that has undergone 1000 charging cycles and is found to be leaking current.

As can be seen from FIG. 6, the initial voltage drop is quite small for the sample 1 (line 602). The voltage drop is in line with the cell DC resistance of 40 mohm (which was further obtained from datasheet and verified by measuring with a milliohmmeter). Indeed, we can see from the graph 602 that voltage drop after 1 seconds is 7.5 mV. DC resistance is thus R=7.5 mV/160 mA=47 mohm. Voltage starts to relax towards the open-circuit voltage of approximately 4.175V (OCV), but a fully relaxed state might take hours to reach. This may not be desirable in all applications, even though short-circuit determination accuracy is increased. For purposes of this example, it was decided to use 600 seconds (10 minutes) as a measurement time. This is practical time to be used also in general when measuring cells similar to the example test.

The accuracy of short-circuit detection might be improved by measuring more than three voltage samples, but in this example test three voltage value samples v(t1), v(t2) and v(t3) were measured with a voltage meter coupled to the samples. The voltage values were measured at three time instants of t1=−1 sec, t2=400 sec and t3=600 sec. Moment of time t=0 sec is the time when the charger is disconnected with an isolator. Time with negative sign (−1 sec for example) refers to time before the disconnection.

Table 2 shows the measured voltage values detected by a controller coupled to the used voltage meter. In the Table, the first voltage value v1 corresponds to a voltage measured at first time instant t1 (−1 sec i.e. while the battery entity (sample cell) was connected to the battery charger). Second voltage value v2 corresponds to a voltage value measured after the battery entity (sample cell) was disconnected from the battery charger (t2=400 sec after the disconnection). Third voltage value corresponds to a voltage value measured at time t3 (600 sec after disconnection).

TABLE 2

Measured and detected voltage values (v1, v2, v3) at time instants t1, t2 and t3

| | 1 | 1b | 2 | 3 | 4 | 5 | 6 | 7 |
|---|---|---|---|---|---|---|---|---|
| v1 | 4.200 | 4.200 | 4.200 | 4.200 | 4.200 | 4.200 | 4.200 | 4.200 |
| v2 | 4.180 | 4.170 | 4.173 | 4.172 | 4.165 | 4.130 | 4.136 | 4.129 |
| v3 | 4.178 | 4.163 | 4.170 | 4.169 | 4.161 | 4.124 | 4.129 | 4.117 |

The detected voltage values (v1, v2, v3) were used to determine an indicator of an internal leakage current. A first indicator is a slope of (v2, v3) and a second indicator is a voltage drop (v1-v2). In particular, the relative slope and relative voltage drop in relation to values of reference sample 1 can be used to determine the indicator of an internal leakage current. Table 3 shows the calculated slopes as well as relative values in comparing to cell sample 1.

TABLE 3

Determined indicator values for the example

| | 1 | 1b | 2 | 3 | 4 | 5 | 6 | 7 |
|---|---|---|---|---|---|---|---|---|
| Slope(v2, v3) | 7.63E−06 | 3.36E−05 | 1.37E−05 | 1.68E−05 | 2.14E−05 | 3.05E−05 | 3.66E−05 | 5.95E−05 |
| Relative to cell of sample1 | 1.00 | 4.40 | 1.80 | 2.20 | 2.80 | 4.00 | 4.80 | 7.80 |
| Voltage drop (v2-v1) | 21.67 | 36.32 | 29.60 | 31.13 | 39.37 | 76.30 | 71.11 | 82.70 |
| Relative to cell of sample1 | 1.00 | 1.68 | 1.37 | 1.44 | 1.82 | 3.52 | 3.28 | 3.82 |

The first indicator for short-circuit is the slope (v2, v3) in relation to reference cell sample 1. In Table 3, we can see that the relative slopes of aged cell samples 2, 3 and 4 are below 3.00 while the internally short-circuited cells and the dead cells have a relative slope of over 4.00. Based on the results, an example limit of 3.00 can be set to indicate a problem related to internal leakage current. For an example, the determined indicator can be used to conclude whether the problem is a short-circuit or some other issue. For input data to collect correlation between indicator value and possible root cause of the problem, more input data can be used (such as history data from previous measurements, cycle life counter, calendar age, temperature etc.). Even without any prior knowledge of battery usage or cell conditions, abnormalities can be detected with the first indicator i.e. relative slope (comparing the slope from v2 to v3 (delta V/delta t) of a reference sample to a sample under testing.

The relative voltage drop (v2−v1) can be used as a second indicator for abnormalities or deviations compared to a fresh cell. The second indicator might not enough alone to distinguish the good and bad cells in all cases. The relative voltage drops of cell samples 2, 3 and 4 are all below 2.00 while for cell samples 5, 6 and 7 they are above 3.00. Based on the results, a limit of 2.00 can be set to indicate an issue for present example. Cell sample 1b does not trigger the limit, even though it is leaking. However, the cell sample 1b leakage is detected with the first indicator of a relative slope.

It is good to note that it is possible to derive the first indicator using two samples v2 and v3. However, based on the experiments, the first indicator is not sufficient to determine the indicator. The second indicator in combination with the first one provides a better overall indication of battery condition. Indeed, in some embodiments if the first indicator or the second indicator indicates a possible problem the battery cell is determined to have a problem and the indicator of the problem is generated. If both the first indicator and the second indicator indicate a possible problem, then the overall indicator could give an urgent alert of a possible failure.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A system for determining an indicator of an internal leakage current of a battery entity, wherein the system comprises:
   a voltage meter configured to be coupled to the battery entity, wherein the voltage meter is configured to measure a plurality of voltage values corresponding to the battery entity at a plurality of time instants;
   an isolator configured to be coupled to each of a battery charger and an electricity consuming entity, wherein the isolator is configured to electrically isolate the battery entity from each of the battery charger and the electricity consuming entity based on a control signal; and
   a controller electrically coupled to each of the voltage meter and the isolator, wherein the controller is configured to:
   detect a first voltage value at a first time instant while the battery entity is electrically connected to each of the battery charger and the electricity consuming entity;
   generate the control signal based on detection of the first voltage value;
   detect a second voltage value at a second time instant while the battery entity is electrically isolated from each of the battery charger and the electricity consuming entity, wherein the second time instant is later than the first time instant;
   detect a third voltage value at a third time instant while the battery entity is electrically isolated from each of the battery charger and the electricity consuming entity, wherein the third time instant is later than the second time instant;
   determine a first slew rate between the first voltage value and the second voltage value based on the first time instant and the second time instant; and
   determine a second slew rate between the second voltage value and the third voltage value based on the second time instant and the third time instant; and
   wherein the plurality of voltage values further comprises a previous first voltage value, a previous second voltage value and a previous third voltage value, each of the previous first voltage value, the previous second voltage value and the previous third voltage value corresponding to a previous time period, wherein the each of the first voltage value, the second voltage value and the third voltage value correspond to a current time period later than the previous time period, the system further comprising a memory configured to store each of the previous first voltage value, the previous second voltage value and the previous third voltage value, and the controller is further configured to:
   determine a previous first voltage difference between the previous first voltage value and the previous second voltage value;
   determine a pervious second voltage difference between the previous second voltage value and the previous third voltage value;
   perform a first comparison between the first voltage difference with the previous first voltage difference; and
   perform a second comparison between the second voltage difference with the previous second voltage difference;
   determine an indicator of the internal leakage current of the battery based on a result of the first voltage value, the second voltage value, the third voltage value, the first slew rate, the second slew rate, the first comparison and the second comparison.

2. The system according to claim 1, wherein the controller is further configured to generate at least one of:
   the control signal based on the first voltage value being at least equal to a target voltage, and
   an alert based on the indicator of the internal leakage current.

3. The system according to claim 1, wherein the measured plurality of voltage values corresponding to the battery entity are measured as at least one of:
   voltage values corresponding to voltage values across an entire battery entity,
   voltage values corresponding to voltage values of at least one cell entity, and
   voltage values corresponding to voltage values of at least one cell.

4. The system according to any claim 1, further comprising a current meter configured to be coupled to the battery entity, wherein the current meter is configured to measure charging current value passing through the battery entity, wherein the controller is electrically coupled to the current meter, and the controller is configured to detect the charging current value being below a predetermined level, and generation of the control signal is further based on detection of the charging current value being below the predetermined level.

5. The system according to claim 1, wherein the controller is communicatively coupled to the battery charger, and the controller is configured to control at least one charging parameter of the battery charger based on the indication of the internal leakage current.

6. The system according to claim 1, wherein the controller is configured to,
determine a first voltage difference between the first voltage value and the second voltage value; and
determine a second voltage difference between the second voltage value and the third voltage value, wherein determination of the indicator of the internal leakage current is based on each of the first voltage difference and the second voltage difference.

7. The system according to claim 1, wherein the controller is configured to transmit, using a communication device, each of the first voltage value, the second voltage value, the third voltage value, the first time instant, the second time instant, the third time instant and an identifier associated with the battery entity to a cloud server, and/or the controller is configured to receive, using the communication device, one or more of each of the previous first voltage value, the previous second voltage value, the previous third voltage value and corresponding time instants of a corresponding previous time period from the cloud server.

8. The system according to claim 1, wherein the first voltage value comprises a plurality of first voltage samples corresponding to a plurality of first time instants, the second voltage value comprises a plurality of second voltage samples corresponding to a plurality of second time instants, the third voltage value comprises a plurality of third voltage samples corresponding to a plurality of third time instants, wherein the controller is configured to:
determine the first voltage value based on the plurality of first voltage samples;
determine the second voltage value based on the plurality of second voltage samples; and
determine the third voltage value based on the plurality of third voltage samples.

9. The system according to claim 1, wherein that the controller is configured to,
generate a circuit model corresponding to the battery entity based on each of the first voltage value, the second voltage value, the third voltage value, the first time instant, the second time instant and the third time instant; and
determine an internal leakage resistance corresponding to the battery entity based on the circuit model.

10. The system according to claim 1, comprising a memory configured to store a training data comprising a plurality of first voltage values, a plurality of second voltage values, and a plurality of third voltage values corresponding to a plurality of distinct time periods and a plurality of indicators of internal leakage current corresponding to the plurality of distinct time periods, wherein the controller is configured to perform machine learning based on the training data, wherein the determination of the indicator of the internal leakage current is based on the machine learning.

11. A device comprising the battery entity and the system according to claim 1 for determining the indicator of an internal leakage current of the battery entity.

12. A device according to claim 11, wherein the device is a mobile device or an electric vehicle.

13. A method of determining an indicator of an internal leakage current of a battery entity, the method comprising:
detecting, using a voltage meter, a first voltage value at a first time instant while the battery entity is electrically connected to each of a battery charger and an electricity consuming entity;
generating, using a controller, a control signal based on the detecting of the first voltage value;
electrically isolating, using an isolator, the battery entity from each of the electricity consuming entity and the battery charger based on the control signal;
detecting, using the voltage meter, a second voltage value at a second time instant while the battery entity is electrically isolated from each of the battery charger and the electricity consuming entity, the second time instant being later than the first time instant;
detecting, using the voltage meter, a third voltage value at a third time instant while the battery entity is electrically isolated from each of the battery charger and the electricity consuming entity, the third time instant being later than the second time instant;
determining first slew rate between the first voltage value and the second voltage value based on the first time instant and the second time instant and a second slew rate between the second voltage value and the third voltage value based on the second time instant and the third time instant;
wherein the plurality of voltage values further comprises a previous first voltage value, a previous second voltage value and a previous third voltage value, each of the previous first voltage value, the previous second voltage value and the previous third voltage value corresponding to a previous time period, wherein the each of the first voltage value, the second voltage value and the third voltage value correspond to a current time period later than the previous time period, the method further comprising:
determining a previous first voltage difference between the previous first voltage value and the pervious second voltage value;
determining a previous second voltage difference between the previous second voltage value and the previous third voltage value;
performing a first comparison between the first voltage difference with the previous first voltage difference; and
performing a second comparison between the second voltage difference with the previous second voltage difference;
determine an indicator of the internal leakage current of the battery based on the first voltage value, the second voltage value, the third voltage value, the first slew rate, the second slew rate, the first comparison and the second comparison.

* * * * *